United States Patent [19]

Black et al.

[11] 4,022,931
[45] May 10, 1977

[54] PROCESS FOR MAKING SEMICONDUCTOR DEVICE

[75] Inventors: James R. Black; Elliott M. Philofsky, both of Phoenix, Ariz.

[73] Assignee: Motorola, Inc., Chicago, Ill.

[22] Filed: June 13, 1975

[21] Appl. No.: 586,700

Related U.S. Application Data

[62] Division of Ser. No. 484,748, July 1, 1974.

[52] U.S. Cl. .................................. 427/91; 29/591; 156/654; 156/655; 357/65

[51] Int. Cl.² ............................... H01L 21/316

[58] Field of Search ........... 357/65, 67, 71; 427/88, 427/91, 248, 282, 287, 294; 29/591, 571; 156/7, 8, 17, 18, 22

[56] References Cited

UNITED STATES PATENTS

| | | |
|---|---|---|
| 3,573,974 | 4/1971 | Castrucci et al. .................. 427/91 |
| 3,620,847 | 11/1971 | Wise ................................ 357/65 X |
| 3,704,166 | 11/1972 | Cuomo et al. .................. 357/65 X |

*Primary Examiner*—William A. Powell
*Attorney, Agent, or Firm*—Henry T. Olsen

[57] ABSTRACT

A semiconductor device having metallization consisting essentially of beryllium. The beryllium makes ohmic contact by deposition on a substrate at 300° C–400° C or it is deposited at lower temperatures and then heat treated to render ohmic the contact to the semiconductor device.

1 Claim, 13 Drawing Figures

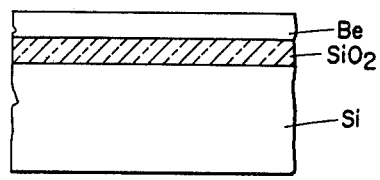
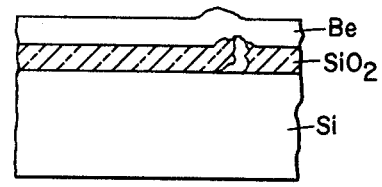
Fig.4a    Fig.4b
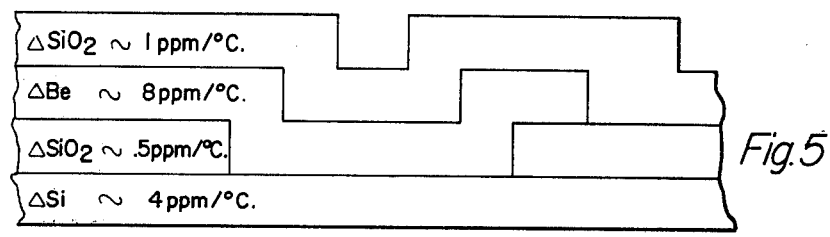
Fig.5
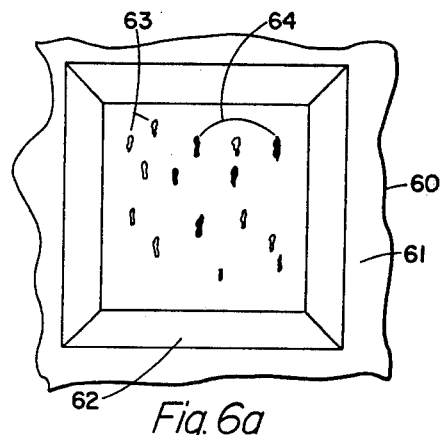
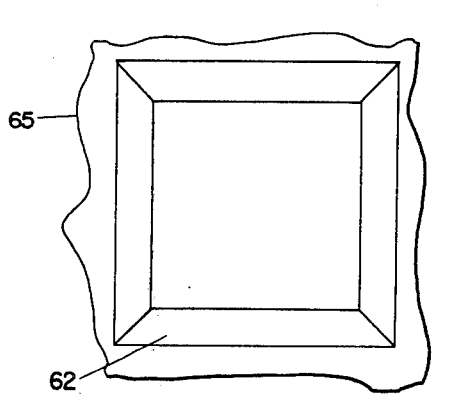
Fig.6b    Fig.6a
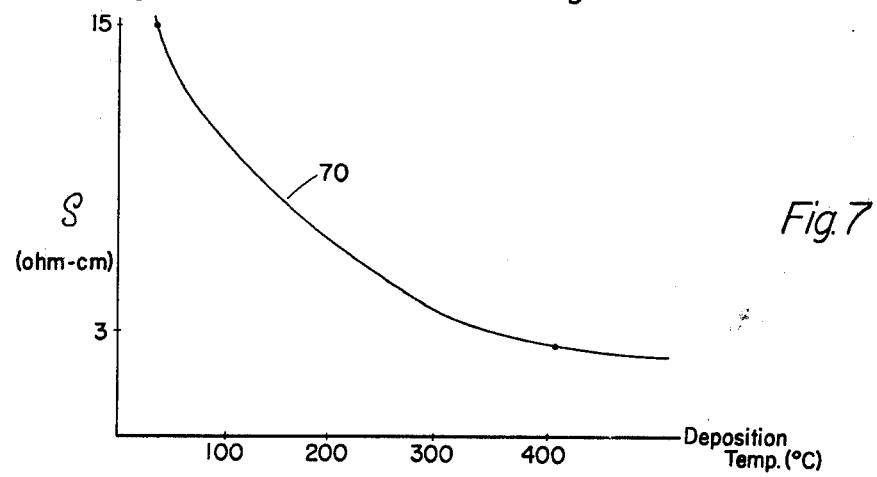
Fig.7

PROCESS FOR MAKING SEMICONDUCTOR DEVICE

This is a division of application Ser. No. 484,748, filed July 1, 1974.

BACKGROUND OF THE INVENTION

This invention relates to semiconductor devices, and more particularly to contact and metallization systems for silicon semiconductor devices. Still more patricularly, this invention relates to a single metal contact and metalization system for silicon semiconductor devices.

The requirements for a material or system of materials to provide ohmic contact to and metallization stripes from semiconductor devices is extremely stringent from a mechanical, electrical, and chemical view. Obviously, first criteria must be that the material provide good electrical conductivity and ohmic contact to the semiconductor region. In standard planar types of semiconductor devices and integrated circuits, the material must not only make good ohmic contact to the silicon but good mechanical contact to the silicon and to the silicon dioxide regions surrounding the contact area. Not only must the material bond well to silicon dioxide, but also particularly in multilevel systems to silica glasses or glasses of other types should have good adherence to the material upon deposition thereon. Preferably, the material has a temperature coefficient of expansion closely matching the material in which it must be in contact. For manufacturing reasons, the material should be easy to deposit by standard evaporation or sputtering techniques and be easily patterned by etching or similar techniques. Since, in certain instances, it will be necessary to bond either gold or aluminum wires to the contact or metallization regions, these materials must be readily bondable to the material by standard thermocompression or ultrasonic bonding techniques. In use, the material should be mechanically strong, corrosion resistant, and not subject to hillocking, electromigration, or similar thermal or electrical stress defects.

The only single metal previously found at all suitable for contacts in interconnections in silicon planar transistors and integrated circuits is aluminum, which material has been widely utilized for these purposes. The three most common problems attendant to the use of aluminum are: (1) pitting of the silicon in the silicon contact area, (2) electromigration, and (3) its thermal expansion characteristic relatice to that of silicon and/or silicon dioxide. The latter characteristic results in hillocking of the metallization stripes, which can crack the dielectric material, particularly in multilevel structures. To some degree, the problems of electromigration and etch pitting of the silicon have been alleviated by the addition of small amounts of alloying impurities such as copper or silicon, into the aluminum. In many cases, it is desirable that gold wires be bonded to the aluminum metallization, and in such case, there is a futher problem in that intermetallic compounds of gold and aluminum are formed. One of these intermetallic compounds is purple in color and, hence, has been referred to as "purple plague", in that intermetallic compounds may result in extremely poor mechanical and electrical characteristics. Another problem attendant to the use of aluminum is its apparently high reactivity with silicon dioxide, which can result in further electrical degradation of the device characteristics.

To overcome some of the defects resultant from the use of aluminum, multi-metal systems have been suggested, which systems usually include gold. Gold is well known as a good electrical conductor, and is extremely resistive to ordinary corrosion. However, it does not adhere well to silicon or silicon dioxide and, more importantly, it readily diffuses into the silicon and results in a lowering of the carrier lifetime. In fact, gold is ordinarily diffused into devices as a charge carrier lifetime "killer", where required. To overcome these problems, it has been necessary to use gold only in combination with barrier metal layers, thereby resulting in requirements of a multilayer metallization system, which system requires additional processing steps contrasted with a single metal system.

OBJECTS OF THE INVENTION

It is an object of the invention to provide semiconductor devices having improved contacts and interconnections thereon.

A still further object of the invention is to provide silicon planar semiconductor devices having improved contacts and interconnections thereon such semiconductor devices being transistors and integrated circuits.

Still more particularly it is an object of this invention to provide improved contacts and interconnections for silicon planar semiconductor device having silicon dioxide passivation thereon.

It is a further object of the invention to provide a new and improved method of depositing improved contacts and interconnections on semiconductor devices and, still more particularly, to provide such improved method of providing contacts and interconnections on silicon planar transistors and integrated circuits of the type having thermal oxide coatings thereon.

A still further object of the invention is to provide an improved contact and interconnection for semiconductor devices which is completely compatible with the relatively standard deposition photomask and etch steps of the prior art, which provides aluminum or other contact and interconnect metals on semiconductor devices.

A further object of the invention is to provide a conductor for semiconductor devices which can vary from relatively low to relatively high resistivities and is thereby useful as resistor interconnects.

A still further object of the invention is to provide an improved contact and interconnect metal for semiconductor devices which has none of the deleterious effects of intermetallics found on the prior art techniques.

A still further object of the invention is to provide a method of depositing such new and improved contact metal for semiconductor devices.

A futher object of the invention is to provide an improved contact and metallization system for semiconductor devices having a high electromigration resistance.

A further object of the invention is to provide planar silicon semiconductors having contacts and interconnect metallization which is resistant to hillocking.

A still further object of the invention is to provide an improved multilayer metallization system for semiconductor devices and method of providng such multilevel metallization thereon.

SUMMARY OF THE INVENTION

In accordance with the foregoing, there is provided an improved contact and interconnect for semiconductor devices which consists essentially of a layer of beryllium metallization, which metallization has a resistivity of the order of 4 ohm-centimeters and a grain size of less than 5000 Angstroms. The beryllium metal layer may be deposited on the semiconductor device by evaporation techniques or ion plating by sputtering, preferably with the semiconductor substrate on which it is deposited being held at a ;temperature range of between 300° to 400° C. An alternative method of depositing the beryllium metal contact and interconnect is to deposit the metal while the substrate is held at substantially room temperature, and thereafter elevating the temperature of the substrate and, hence, the metal above 400° C whereby an ohmic contact is formed to the semiconductor device. The foregoing process results in a metallization system wherein the contact to the semiconductor is of low resistivity while the interconnect is of a higher resistivity, thereby useful as a resistor for the semiconductor device.

THE DRAWINGS

Further objects and advantages of the invention will be apparent from the following complete description thereof and from the drawings wherein:

FIGS. 4a–4b are illustrations of the advantages of the present invention.

FIG. 5 is an enlarged cross-section of the device.

FIGS. 6a–6b are enlarged plan views of contact areas.

FIG. 7 is a graph of resistivity versus deposition temperature.

COMPLETE

COMPLETE DESCRIPTION OF THE INVENTION

In accordance with the invention, there is provided an improved single metal contact and interconnect for semiconductor devices consisting essentially of beryllium. Beryllium is the fourth element in the periodic table and is a light, steel gray metal, occurring in relatively great abundance in the earth's crust, mainly as a silicate of beryllium an aluminum. Its use heretofore has been mainly in alloying with other metals, for example, beryllium copper and beryllium steel and as windows in X-ray tubes. Some use of the metal has been found more recently in the space program, because of its high strength/weight ratio. Contrary to some reports, it has been discovered, in accordance with the invention, that the conductivity of beryllium is almost as high as that of aluminum. While beryllium metal is relatively rare and, hence, costly, it is far more economical than gold.

Figure 1:
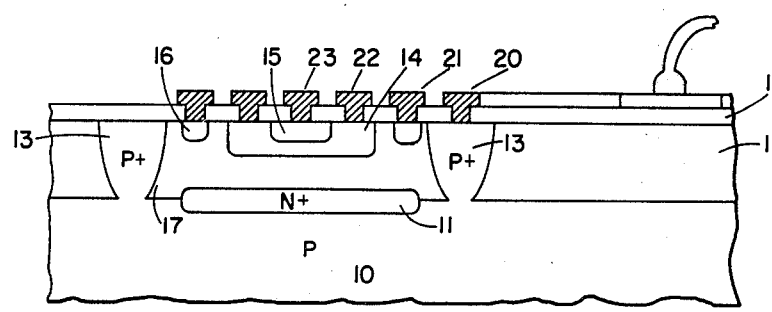
FIG. 1 is a cross-sectional view of a portion of a semiconductor device in accordance with the invention.
Figure 2:
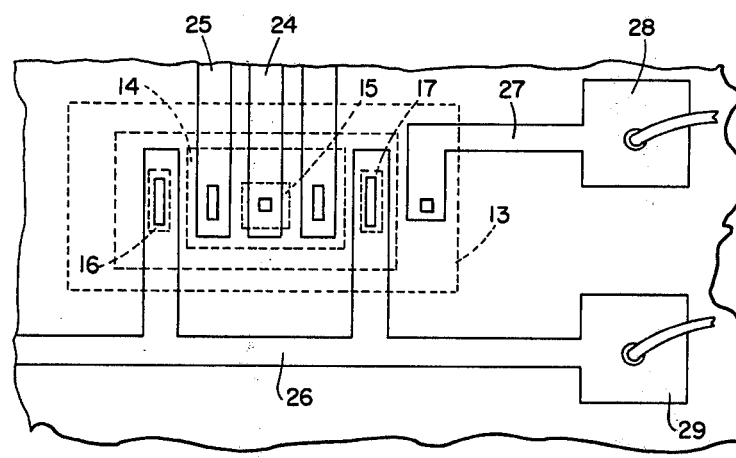
FIG. 2 is a top plan view of the device of FIG. 1.

By way of illustration of a semiconductor device in accordance with the invention, there is depicted in FIGS. 1 and 2, a portion of a bipolar integrated circuit which inludes a substrate 10 of P-type conductivity in which a buried layer 11 of N-type conductivity is diffused. An epitaxial layer 12 of N- conductivity material is grown thereon. In accordance with standard masking and diffusion techniques, the junction isolation regions 13, the base region 14, the emitter region 15, and the collector contact region 16 are formed therein. The region then defined by the junction isolation regions 13 is the collector region 17 for the transistor structure. For the puroprose of clarification, it has been assumed that all masking materials have been removed following formation of the above regions.

A new layer 18 of silicon dioxide is thermally grown or otherwise deposited, as by vapor deposition, sputtering, or spinon techniques, over the entire surface of the semiconductor device. A layer of beryllium metal is then deposited over the layer 18 of silicon dioxide to form the isolation contact 20, the collector contact 21, the base contact 22 and the emitter contact 23, all contacts being ohmic contacts to the respective regions. Following masking, the beryllium metallization layer is suitably etched to define emitter interconnect 24, (FIG. 2) base interconnects 25, collector interconnects 26, isolation group interconnects 27 and bonding pads 28 and 29. The contacts and interconnects need not be connected directly to bonding pads as illustrated but may connect to other of the electrical components of the integrated circuit.

The integrated circuit may then be connected into a suitable package by bonding wires, preferably of gold, which bonding wires may be readily the thermocompression or ultrasonically bonded to the beryllium bonding pads 28 and 29. Aluminum, copper, or other suitable bonding wires may also be ohmically connected to the bonding pads for package connection.

The gold wire bonds well to the beryllium metallization with no deleterious intermetallic compounds are observed to be formed, such as, the "purple plague" formed between gold wire and aluminum metallization In the preferred processing in accordance with the invention, the beryllium metal is evaporated onto the semiconductor substrate while the substrate is held at a temperature of approximately 325° C. As shall be pointed out in further detail hereinafter, the substrate may be held at approximately room temperature but it is preferred that the temperature range be 300° to 400° C. At this temperature the beryllium grains deposited may vary in size, i.e., crystallites may form of up to about 1000 Angstroms and much less than 5000 Angstroms. This grain size produces very fine metallization geometries when etched. Typically the higher the temperature of the substrate, the larger the grain size. Thus, temperature near the lower part of the temperature range, i.e., about 300° C is preferred. Above 400° C the thermal expansion characteristic of the beryllium relative to the silicon dioxide and the silicon becomes a factor. the adherance of the beryllium to the silicon dioxide is excellent and if the substrate is held at a temperature of over about 400° C, the difference in thermal expansion characteristic of the Si (approximately four parts per million per degree centigrade) as contrasted with beryllium (8 parts per million per degree centigrade) can cause the shrinkage of the beryllim on cooling to strip the silicon dioxide from the silicon substrate.

These results demonstrate that the bond between the beryllium metallization and the silicon dioxide is stronger than the bond between the thermally grown silicon dioxide and the silicon wafer itself. This also demonstrates the improved strength of the beryllium metallization as contrasted with aluminum.

Figures 3A, 3B, 3C:
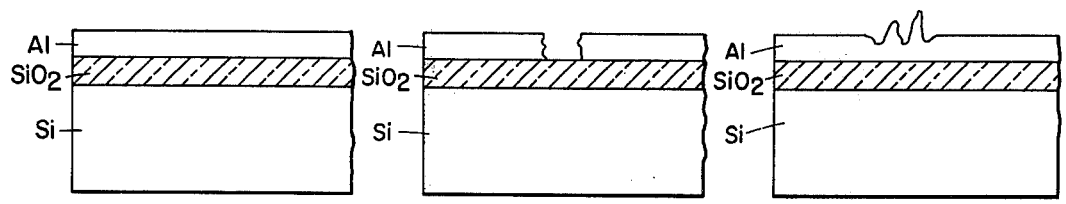
FIGS. 3a–3c are illustrations of the prior art.
Figure 8:
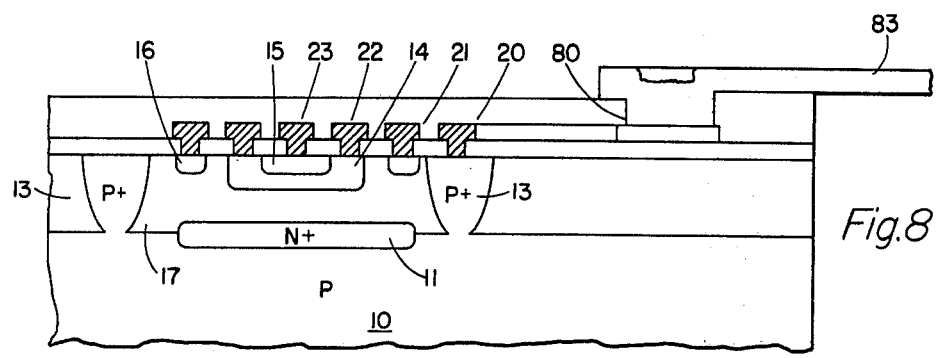
FIGS. 8 and 9 are cross-sectional and plan views of a further embodiment of the invention.

The effect of improper deposition conditions for aluminum is schematically represented in FIGS. 3a–3c. Thus, assuming, in FIG. 3a, a deposition of aluminum is performed on a silicon dioxide covered silicon substrate at any given temperature. If the substrated temperature is high during aluminum film deposition, upon cooling this aluminum will go under tension but it relieves this tension by thinning through a solid state diffusion process. When heated, the aluminum film expands, i.e., goes under severe compression which is relieved by hillock growth, again through a diffusion process. The hillock formation is further undesirable if a passivation glass has been placed over the entire wafer or in the multilevel metallization system where a glass is placed over the aluminum metallization because the hillocks can result in cracking of the covering glass.

The effect of deposition temperature on the beryllium metallization deposited on the silicon dioxide covered silicon wafer is shown in FIGS. 4a and 4b. A good coherent layer of beryllium metallization will be deposited on the silicon dioxide at any temperature from room temperature up to several hundred degrees. The effect of deposition over about 400° C is shown in FIG. 4b where as the wafer is lowered to room temperature, the high tensile strength of the beryllium metallization and its excellent adherence to the silicon dioxide can crack the silicon dioxide and lift it from the silicon substrate. However, this condition is easily avoided by proper processing temperature, as before mentioned. When deposited at lower temperatures, this relatively small temperature difference experienced when cooling to room temperature reduces the stress developed, thus eleminating rupture of the glass silicon dioxide.

To more fully depict the advantages of the present invention, FIG. 5 schematically shows four layers of material representative of a silicon planar semiconductor device. In accordance with the invention, the bottom or first layer is the silicon substrate having an expansion coefficient of approximately four parts per million per degree centigrade. The $SiO_2$ insulating layer has an expansion coefficient of one half part per million per degree centigrade and is in contact with the silicon. The beryllium metallization layer having an expansion coefficient of 8 parts per million per degree centrigrade is in contact with both the $SiO_2$ and in ohmic contact with the silicon semiconductor device. A passivating $SiO_2$ layer having an expansion coefficient of approximately one part per million per degree centigrade overlies the entire structure. Thus, as the actual device becomes elevated in temperature, the beryllium and silicon layers will tend to "stretch" the $SiO_2$ layers or viewing it on the other hand, the $SiO_2$ layers will resist the expansion of the silicon and beryllium layers, in the silicon contact area. The silicon and the silicon dioxide will resist the expansion of the beryllium metallization, or viewing it on the other hand, the beryllium layer will tend to stretch the $SiO_2$ and silicon layers in the areas at which it is adhered.

As noted previously, the temperature at which the substrate is held during deposition of the beryllium and has an effect on the grain size of the metallization layer. The grain size is an important factor in the etching of fine geometries in the metallization. In aluminum metallization which often is deposited at high temperature, the crystallites become relatively large, that is, of the order of 10,000 to 100,000 Angstroms or larger. With the beryllium metallization, in accordance with the invention, all the beryllium crystallites will be much less than 5,000 Angstroms if deposited below 450° C and generally less than 1,000 Angstroms with lower deposition temperatures. Grain size is a very important factor on the etchability of the material because, in general, the boundaries between the grains will etch more readily than the material in the grains, thus, the larger the grain size, the more irregular will be the line etched into the material. Thus, with finer grain sizes more precise, tightly spaced geometry of metallization patterns may be utilized. The fine grain beryllium metallization, in accordance with the invention, having a grain size of at least less than 5,000 Angstroms and normally less than 1,000 Angstroms, results in extremely high tolerance metallization patterns after etching.

As is well known, aluminum metallization for silicon simiconductor devices alloys with the silicon, however, the alloy to the silicon results in localized solution of the silicon into the aluminum which solution causes etch pits. These etch pits can result in shorting of shallow junctions in the devices. Silicon has previously been added to the aluminum metallization to overcome or minimize this problem. However, when the silicon is added to the aluninum metallization and when the metallization is etched, silicon crystallites which are not dissolved by the aluninum etchant material remain as dust on the surface of the device. Silicon does not dissolve into beryllium, therefore no etch pits can grow when that metal is used to contact silicon. A comparison of the etch pits resulting from aluminum metallization and the lack of etch pits resultant from the beryllium metallization, in accordance with the invention, is diagrammatically depicted in FIGS. 6a and 6b. FIG. 6a is a plan view of a portion of a silicon semiconductor device 60 having a silicon dioxide coating 61 thereon. A window 62 exposes the surface of the silicon semiconductor device. The device was metallized with an aluminum-silicon alloy in accordance with the prior art and heat treated to assure ohmic bonding. The metallization was then removed and the etch pits 63 appear as shown. Also, silicon crystallites 64 from the aluninum silicon alloy remain on the surface of the silicon semiconductor device. A contrasting result is reached with the beryllium metallization as shown with semiconductor chip 65 having a window 66 therein, which device 65 was metallized with beryllium metal in accordance with the invention, tested to assure ohmic contact to the silicon, and the beryllium metallization removed. On the same magnification, no etch pits appear in the silicon semiconductor devic, thus indicating no alloying of the beryllium to the silicon. The chemical activity of the beryllium metal relative to the chemical activity of silicon is such that any very thin oxide film remaining in the window covering the silicon surface is reduced by the beryllium. Thus, the deposit of beryllium forms a chemical bond with the silicon surface. This degree of chemical activity also explains the excellent adherence of the beryllium metallization to the silicon dioxide layer on the wafer which activity might lead one to conclude that mechanical and electrical degradation of the insulating film would result. It has been observed, however, that the chemical activity between the beryllium and the silicon dioxide is self limiting and only a minor amount of the silicon dioxide insulating layer is attacked by the beryllium metallization.

FIG. 7 is a graph illustrating the effect of substrate deposition temperature on resistivity of the beryllium metallization. As shown by the curve 70, if the beryllium metallization is deposited with the substrate temperature at approximately room temperature, the resultant metallization has a resistivity of approximately 15 ohm-centimeters. At about 250° C the resistivity is reduced below 5 ohm-centimeters. Therefore, as previously noted, it is preferred that the metallization be deposited between 300° C and 400° C. However, when the metallization is deposited at the lower temperature, it has been found that heat treatment at a temperature between 400° C for about one hour makes an ohmic contact. Thus, if it is desired to use the interconnects as load resistors for the integrated circuit, one may conveniently deposit at the lower temperature to attain 15 ohm- centrimeter interconnects and then attain ohmic conection to the silicon integrated circuit by the foregoing heat treatment.

Since the beryllium appears to make ohmic contact to the silicon without any significant alloying therewith, and since beryllium is a Group II metal, the N+ diffusion for the collector may not be necessary. However, it has been utilized as disclosed since it is compatible with present available masks.

The electromigration characteristic of beryllium metallization is approximately ten times better than that of aluminum. At one million amps per centimeter beryllium metallization does not fail in any reasonable time period. At $10^7$ amps per square centimeter, failure has been observed. However, as above noted, because of etch characteristic of the beryllium metallization, the current density may be reduced by utilization of thicker metallization films.

The reaction between beryllium and silicon dioxide would appear to be more reactive than aluminum with silicon dioxide and, hence, it would be expected to lead to pitting of the silicon oxide or rupture of the silicon dioxide film. However, this reaction, that is the reaction of beryllium plus silicon dioxide to yield beryllium oxide and silicon, would appear to be self limiting since no significant pitting of the silicon dioxide has been found even when the devices have been heat treated above 700° C. Aluminum metallization, because of its reactivity with silicon dioxide, is generally considered to be limited in temperature to about 450° C to 520° C for processing, as for example, in sealing of the device into a package. With the beryllium metallization as above noted, degradation of the beryllium metallization is not noted at 600° C to 700° C and, hence, sealing packages or other post metallization processes using relatively high temperatures may be readily accomplished. Thus, the normal problem of attaining a truly hermetic package which is encountered when using low temperature sealing glasses is avoided.

Figure 9:
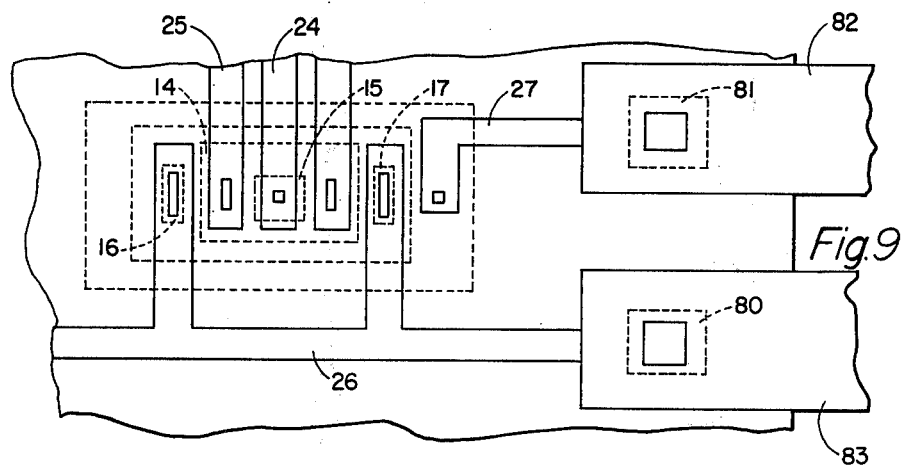

It is thus possible because of a temperature characteristic of the beryllium metallization and because of the characteristic strength of the beryllium metal, that a new form of beam lead type of package may be utilized. Subsequent of the formation of the integrated circuit device depicted in FIG. 1, the packaging may be completed without the utilization of bonding wires. Instead, prior to this step, a relatively thick layer of insulating material such as glass is placed over the entire surface of the device. Windows 80, 81 are opened through this glass layer to expose the bonding pads 28', 29'. Then a thick layer of beryllium metallization of approximately 5 microns is deposited on the wafer, which layer is then patterned to form the beam leads 82, 83 (FIG. 9) and completes a simple hermetic package.

What is claimed is:
1. A process of manufacturing a semiconductor comprising providing a semiconductor substrate with an insulative layer;
    opening a window in said insulative layer to expose said semiconductor substrate; and
    depositing beryllium on said insulative layer and said substrate at a temperature between 300° C and 400° C to form an ohmic contact with the substrate.

* * * * *